United States Patent [19]
DiLorenzo et al.

[11] 4,426,656
[45] Jan. 17, 1984

[54] GaAs FETs HAVING LONG-TERM STABILITY

[75] Inventors: James V. DiLorenzo, Millington; James C. Hwang, Berkeley Heights, both of N.J.; William C. Niehaus, Wyomissing, Pa.; Wolfgang O. W. Schlosser, Basking Ridge; Stuart H. Wemple, Chatham Township, Morris County, both of N.J.

[73] Assignee: Bell Telephone Laboratories, Incorporated, Murray Hill, N.J.

[21] Appl. No.: 229,744

[22] Filed: Jan. 29, 1981

[51] Int. Cl.³ .......................................... H01L 29/80
[52] U.S. Cl. ........................................ 357/22; 357/52
[58] Field of Search .................................... 357/22, 52

[56] References Cited
U.S. PATENT DOCUMENTS 4,196,439  4/1980  Niehaus et al. ...................... 357/22
4,301,188  11/1981 Niehaus ................................ 357/67

*Primary Examiner*—James W. Davie
*Attorney, Agent, or Firm*—Bruce S. Schneider

[57] ABSTRACT

GaAs FETs exhibit excellent long-term stability if they have a drain ledge, a drain contact with reduced dendrite size, and a silicon nitride passivation layer. Accelerated aging tests at device case temperatures of 250 degrees C. indicate essentially no device failures after 200 hours of observation and a median failure time of approximately 500 hours.

6 Claims, 3 Drawing Figures

GaAs FETs HAVING LONG-TERM STABILITY

BACKGROUND OF THE INVENTION

1. Field of the Invention

This invention relates to semiconductor devices and, more particularly, to field effect transistors (FETs).

2. Art Background

The use of gallium arsenide field effect transistors (GaAs FETs) in microwave circuitry although recently initiated has rapidly increased. These FETs which include a drain, a source and a gate to control current flow between the source and drain, presently are contemplated for use in among other applications the microwave processing circuitry of telecommunication satellites. Obviously for applications such as satellite circuitry it is necessary that the components employed have an extremely long operating lifetime.

Precautions are now being taken in the production of GaAs FETs to enhance device lifetime. For example, the use of a ledge configuration for the contact pad of a GaAs FET has been found useful for enhancing lifetime. (See U.S. Pat. No. 4,196,439, issued Apr. 1, 1980.) Further lifetime enhancement is achieved by limiting dendrite formation during production of the drain and source contacts. In this technique when a metallization layer is alloyed into the GaAs pad to form an electrical contact, the composition of the metallization layers and the conditions used during alloying are carefully controlled to prevent extension of dendrites into the GaAs active region. (See U.S. Pat. No. 4,301,188 Nov. 17, 1981, by William C. Niehaus, that is hereby incorporated by reference.) An inert layer deposited on the exposed surface of the finished device to form a passivation region is also generally useful in semiconductor devices to increase production yield. A passivation region is employed to protect the surface and to avoid the introduction of impurities from the ambient into the active regions of the device. Although the previously described techniques have shown promise for improving device lifetimes, these devices are as yet not completely satisfactory for demanding applications such as required in telecommunication satellites.

SUMMARY OF THE INVENTION

By utilizing in combination a ledge pad for the drain contact, a drain contact formed in a manner that prevents dendrite penetration into the GaAs active region, and a passivation layer of a material such as silicon nitride, the lifetime of GaAs FETs as measured by accelerated aging tests is enormously extended. For example, at an ambient aging temperature of 250 degrees C., devices having a drain ledge pad, an appropriate drain contact, and a silicon oxide passivation layer exhibited median lifetimes of 3 hours. In contrast, identical devices utilizing a silicon nitride passivation layer instead of a silicon oxide layer show substantially no failures under the same conditions after 200 hours and have a median life of approximately 500 hours. This enormously extended lifetime as indicated by accelerated aging tests demonstrates that appropriately produced GaAs FETs are suitable for the most demanding applications.

DETAILED DESCRIPTION

Figure 1:
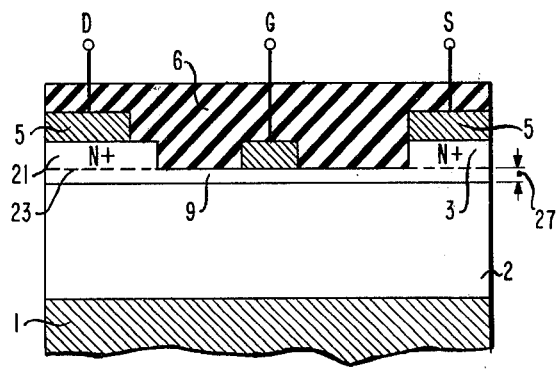
FIGS. 1 and 2 illustrate devices within the subject invention.

As discussed, the excellent lifetimes achievable with the subject invention require a combination of device structures. First, the device should have the drain ledge as described in U.S. Pat. No. 4,196,439, issued Apr. 1, 1980 which is hereby incorporated by reference. Briefly, this ledge is formed from a highly doped layer of GaAs, i.e., a layer having a majority carrier concentration greater than that of the active region, preferably at least 10 times that of the active region. It should be noted that in the case of the device illustrated in FIG. 1, the ledge is geometrically distinct, i.e., the ledge, 21, in FIG. 1 is easily identified since it geometrically projects above the active region. Therefore, the criterion for relative majority carrier concentrations is easily discerned.

In the case of a geometrically discernable ledge, the highest majority carrier concentration, $N_{max}$, below the imaginary dotted line, 23, the boundary of the active region, is determined by conventional techniques, such as Capacitance-Voltage profiling described in G. L. Miller, *IEEE Transactions on Electron Devices*, ED-19, 1103 (1972). The majority carrier concentration profile of the region above the imaginary dotted line should be such that dendrites formed during contact fabrication terminate within a region having a majority carrier concentration greater than $N_{max}$.

Figure 2:
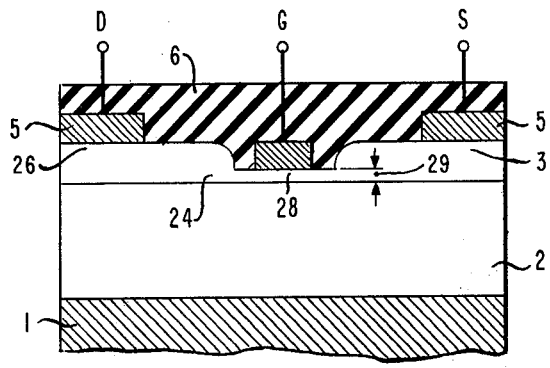

Another device structure, however, exists where the situation on the surface is not as clear. It is possible that the ledge area is not geometrically distinct, but is merely formed by a region of increased majority carrier concentration. In such case as illustrated in FIG. 2, the $N_{max}$ is the highest majority carrier concentration below the gate, i.e., in region 28. Again the dendrites formed during contact fabrication should terminate within an area having a higher concentration than $N_{max}$. (In either of the structures illustrated by FIGS. 1 and 2, the ledge is considered this region of carrier concentration greater than $N_{max}$.)

The ledge is formed to extend beyond the edge of the drain contact towards the gate. Generally the length of this extension should be in the case of a geometrically defined ledge at least equal to the thickness of the active region, 27, measured below the imaginary line and in the case of no geometrically defined ledge at least the thickness of the active region, 29, at a point below the gate. For typical devices, the ledge length should be in the range 0.5 to 3 μm. However, it is preferable that the ledge not extend so that it is less than 0.5 μm from the gate. If the ledge does approach the gate too closely, chances are significantly increased that undesirable avalanche effects will occur at the drain side of the gate. (See Wemple et al, *IEEE Transactions on Electron Devices*, ED-27, 1013 (1980).)

The contacts are formed as described in copending U.S. Pat. No. 4,301,188 issued Nov. 17, 1981, by William C. Niehaus, (which is hereby incorporated by reference) in a manner to avoid the penetration of metal dendrites through the ledge into the GaAs active region, e.g., that region denoted 9 and 24 in FIGS. 1 and 2, respectively, where 1 denotes the GaAs substrate, 2 denotes a semi-insulating layer of GaAs, 9 and 24 denote the GaAs active region, 3 and 21 (26 in FIG. 2) denote the source and drain ledge, respectively, and 5 denotes the contact region of the source and drain above the ledge. In a preferred embodiment to avoid the formation of dendrites that penetrate the GaAs active region, the pad is first metallized with a layer of Au/Ge alloy (12 weight percent Ge), followed by a layer of Ag and a layer of Au. The thicknesses of these layers are preferably in the range 10 to 400, 800 to 1200, and 1000 to 1500, respectively. Once the metallization is completed, the metal layers are alloyed at a temperature preferably between 400 and 450 degrees C., most preferably between 400 and 420 degrees C. For ledges of thicknesses in the range 0.1 $\mu$m to 1.0 $\mu$m, alloying times in the range 1 sec. to 60 sec. are appropriate. It is possible to perform the alloying by raising the temperature from room temperature to an alloy temperature in the range specified above. If this approach is taken, alloying is preferably terminated as soon as the final temperature is reached. (Although thicker ledges are not precluded, they lead to excessive material cost and processing time.)

Once the device including the gate, source, and drain is completed the entire device is passivated. (For a description of a general fabrication technique, for GaAs FETs which discloses appropriate fabrication procedures except for the formation of the contacts and ledges (see W. C. Niehaus et al, *Gallium Arsenide and Related Compounds* (St. Louis) page 271 (1976).) In the subject invention, the device is passivated using a layer that substantially prevents the oxidation of the underlying GaAs, e.g., a silicon nitride layer, 6. It has been found that the presence of even small amounts of an oxidizing agent reaching the GaAs active layer of the device significantly decreases device lifetime. In particular, since silicon oxide contains oxygen, some of which is available to interact with the GaAs, adverse results occur with this passivation material. Similarly when no passivation layer is employed and the device interacts with the atmosphere, adverse results also occur. It is contemplated that the oxygen either from the atmosphere or from the passivating layer reacts with the GaAs to form gallium oxide and elemental arsenic. Device failure is then initiated through high field formation in the areas where the elemental arsenic is formed. These high fields lead to catastrophic failure and to shortened lifetimes.

Despite the apparent usefulness of a layer that substantially avoids oxidation, e.g., silicon nitride, use of a passivating layer such as silicon nitride deposited preferably in a reducing atmosphere on a device without the previously described drain ledge and drain contact, does not result in significantly improved lifetimes. Generally, when the drain ledge or appropriate drain contact is not employed, lifetimes achieved using a nitride passivation layer are substantially degraded. Thus avoidance of an oxidizing agent alone through use of a passivation layer is inadequate to yield the desired enhanced lifetimes.

In a preferred embodiment, a silicon nitride passivating layer is employed that is formed in a reducing atmosphere by plasma-assisted chemical vapor deposition from an ammonia and silane mixture. The device is held in the temperature range from 275 to 300 during deposition. This procedure has two significant advantages. The decomposition of silane and ammonia to produce free hydrogen insures that a reducing atmosphere is achieved and thus oxidation of the active region during deposition is avoided. Additionally, 15 to 19 atomic percent of hydrogen is incorporated into the silicon nitride layer and it is contemplated that this hydrogen enhances the ability to prevent oxidizers from reaching the underlying device layers.

Figure 3:
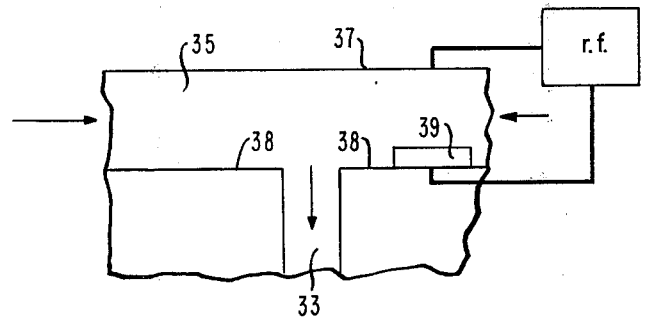
FIG. 3 illustrates an apparatus useful in producing the subject device.

In a preferred embodiment, the device, 39, (FIG. 3) with its ledge and contacts is placed on the grounded electrode, 38, of an rf plasma reactor of the parallel plate design with a radial inward gas flow. (A suitable apparatus is described in U.S. Pat. No. 3,757,733.) The apparatus is evacuated, for example, through conduit 33 in FIG. 3 and then a partial pressure in the range 1.0 to 1.5 Torr of an ammonia and silane mixture with a carrier gas, e.g., argon or nitrogen, is introduced through conduit 35. The ratio of ammonia to silane should be in the range 1.62 to 2.05, preferably 1.81 to 2.05. The total reactant gas to carrier gas concentration generally should be in the range 1 to 2 percent. The flow rate of the combined gas mixture should be adjusted to allow sufficient excitation of the gas molecules in the plasma and uniform thickness of the deposited layer. Generally for apparatus configurations as shown in FIG. 3, flow rates in the range 100 standard cubic centimeter per minute (SCCM) to 300, preferably 105 to 200 SCCM are appropriate. (Since the object is to eliminate and exclude oxygen contamination, conventional precautions such as using high purity gases and high vacuum conditions in an essential leak tight apparatus are employed.)

A plasma is then struck in the gaseous mixture by utilizing parallel electrodes, 37 and 38, (typically 5 to 10 inches in diameter) that are 1 to 1½ inches apart and by utilizing an rf power density applied to these plates in the range 0.10 to 0.15 Watts/cm$^2$. Generally, deposition rates in the range 50 to 150 Angstroms per minute are achieved utilizing the specified conditions. For most applications, passivation layers having thicknesses in the range 0.1 to 1 $\mu$m are sufficient to produce quite advantageous lifetimes. Generally, thicknesses greater than 1 $\mu$m, although not precluded, are not desirable due to the increased deposition time and increased tendency to crack. Thicknesses less than 0.1 $\mu$m typically are not adequate to provide the necessary shielding from oxidants and to withstand typical processing handling.

The following example indicates suitable conditions for producing the subject device.

EXAMPLE

A semi-insulating layer of GaAs was deposited on a single crystal GaAs wafer. Approximately a 1 $\mu$m thick layer of sulfur-doped GaAs (majority carrier concentration of approximately $5 \times 10^{16}$/cm$^{-3}$) was then deposited on the semi-insulating layer as described in a paper by H. M. Cox and J. V. DiLorenzo, *Institute of Physics Conference, Series No.* 33B, St. Louis (1977) page 11. During the deposition of this sulfur-doped GaAs region, after the 1 $\mu$m thickness was obtained, the amount of sulfur doping was increased so that a 0.25 $\mu$m thick region of N$^+$ GaAs (majority carrier concentration of approximately $1 \times 10^{18}$/cm$^{-3}$) was formed. Mesas having a cross-sectional dimension of ½ mm by 1 mm were then formed by conventional ion milling techniques. A device configuration such as described in W. C. Niehaus et al, supra, was then formed on each mesa. However, unlike the device in the Niehaus paper, the subject devices had a repetitive structure utilizing 7 sources and 6 drains. These sources and drains were formed utilizing a conventional photolithographic technique. A photoresist was coated onto the N$^+$ layer. Drain and source openings were made in the photolithographic film by appropriate exposure to light and development where the source openings produced had a dimension of approximately 50 μm long by 500 μm wide and drain openings had dimensions of approximately 125 μm long by 500 μm wide.

The wafer was placed in an evaporation apparatus. A resistively heated boat was filled with an Au/Ge eutectic and 400 Angstroms of the film resulting from evaporation of this eutectic was deposited onto the wafer. This film thus coated both the resist material and the exposed portions of the underlying N+ layer. After this deposition, 1000 Angstroms of silver and 1250 Angstroms of Au were sequentially evaporated from resistively heated boats onto the Au/Ge layer. The resist and its overlying metal layer were then removed by conventional liftoff techniques. To alloy the contacts, the device was placed in a helium atmosphere and heated to 420 degrees C. This heating procedure was done by increasing the temperature from room temperature to the desired end temperature of 420 degrees C. at a rate of 400 degrees C. per minute. As soon as the 420 degree C. was reached, the heating procedure was terminated.

A photoresist was then coated on the top of the processed wafer. An opening in the photoresist was made by conventional techniques so that all of the uncoated N+ layer was exposed except for a region of approximately 2 μm that extended from each drain towards its matching source beyond the edge of the metallization pattern formed on the drain for its contact. The uncovered region of N+ material was then removed by wet chemical etching and the resist material was removed with acetone forming the ledge configuration for the drain shown in FIG. 1. Using conventional photolithographic and chemical etching techniques, twelve notches having dimensions 2 μm long and 500 μm wide and 1200 Angstroms deep were formed in the GaAs active region. A notch was located approximately half way between the edge of the drain ledge and the edge of the source. A 1 μm thick layer of aluminum was then evaporated onto the wafer producing a similar thickness of aluminum in the notch and upon the resist used to define the notch. The resist material used to define the notch was then removed using conventional liftoff techniques.

Another photolithographic resist was coated onto the wafer. The resist was then exposed and developed to open windows over the source contacts, the drain contact, and over any bus bars employed to connect to these contacts. Layers of titanium, platinum, and gold were sequentially deposited onto the wafer in thicknesses of 2,000, 2,000 and 10,000 Angstroms, respectively, by E-beam evaporation. A second resist layer was then deposited over the metallization formed on the existing resist material that was used to define the holes for the Ti/Pt/Au evaporation. The second resist layer was exposed and developed so that the resulting pattern was the negative of that obtained in the first resist material, i.e., holes were present everywhere except over the source, drain, and bus bar contacts. Ion milling using an argon beam having an acceleration potential of approximately 1000 V was employed to remove the Au and Pt layers uncovered after development of the second resist layer. It should be noted that milling was terminated after the removal of the Au and Pt layers leaving the underlying Ti layer intact. The conventional technique of acetone spraying was employed to remove the first and second resist layers. As a result of this liftoff procedure, the remaining Ti layer not removed during ion milling was also eliminated.

The wafer was then cleaned by sequentially spraying in acetone and methanol. The wafer was then blown dry with dry nitrogen. To complete the drying, the wafer was baked in a nitrogen environment at 100 degrees C. The wafer was then placed on the grounded electrode of a plasma deposition apparatus having the configuration shown in FIG. 3. This apparatus was of a radial inward flow design utilizing 5 inches in diameter circular electrodes that were parallel and separated by approximately 1 inch. (Before loading the samples it was insured that the grounded electrode was at a temperature below 100 degrees C.) The apparatus was evacuated to a pressure below 0.1 Torr.

An environment was established in the apparatus by introducing a 3% electronic grade silane in argon mixture, a 5% electronic grade ammonia in argon mixture, and an undiluted flow of electronic grade argon. These three gaseous components were introduced at flow rates of 36, 44, and 100 SCCM, respectively, and yielded a total pressure of 1.5 Torr in the reactive chamber. A plasma was ignited by applying a 13.6 MHz signal to the ungrounded electrode with a total power of 15 W. The plasma was maintained for approximately 30 minutes resulting in the deposition of a 4000 Angstrom thick silicon nitride layer on the wafer. The plasma was extinguished, the apparatus was vented, and the wafer was removed. The resulting wafer was processed to produce discrete devices.

The devices were tested by first applying a 30 V source-drain bias with source-drain currents of 550 milliamps. Inherently poor devices were destroyed. The remaining devices were tested under accelerated biased temperature aging conditions utilizing a heated environment that resulted in a 250 degree C. temperature at the metal case of the device. A bias between the source and drain of 14 V was employed and the gate was grounded to the source. The current measured at the drain was approximately 500 milliamps. Under these test conditions, the median time to failure was 500 hours.

What is claimed is:

1. In a field effect transistor device comprising an active region of GaAs, a source, a gate, and a drain wherein said drain comprises a drain ledge contacting said active region and an electrical contact to said drain ledge CHARACTERIZED IN THAT said device is passivated with a material that prevents oxidation of said active region, said ledge extends beyond the edge of said contact in the direction of said gate, and dendrites formed during the fabrication of said contact terminate with the boundaries of said ledge.

2. The device of either claim 1 wherein the extension of said ledge beyond said contact is at least equal to the thickness of said active region at a point below said gate.

3. The device of either claim 1 wherein said passivating material comprises silicon nitride.

4. The device of claim 3 wherein silicon nitride contains hydrogen.

5. The device of claim 4 where said silicon nitride is formed by striking a plasma in an environment comprising ammonia and silane.

6. The device of claim 5 wherein the ratio of ammonia to silane is in the range 1.62 to 2.05.

* * * * *